United States Patent
Passaniti et al.

(10) Patent No.: US 11,847,897 B2
(45) Date of Patent: Dec. 19, 2023

(54) SYSTEM AND METHOD FOR PRESENCE DETECTION IN AN ENVIRONMENT TO BE MONITORED

(71) Applicant: STMicroelectronics S.r.l., Agrate Brianza (IT)

(72) Inventors: Fabio Passaniti, Syracuse (IT); Enrico Rosario Alessi, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 340 days.

(21) Appl. No.: 17/217,647

(22) Filed: Mar. 30, 2021

(65) Prior Publication Data
US 2021/0312778 A1   Oct. 7, 2021

(30) Foreign Application Priority Data
Apr. 1, 2020   (IT) .................... 102020000006883

(51) Int. Cl.
*G01R 29/12*   (2006.01)
*G08B 13/24*   (2006.01)
(Continued)

(52) U.S. Cl.
CPC ......... *G08B 13/2494* (2013.01); *G01R 29/12* (2013.01); *G01R 29/14* (2013.01);
(Continued)

(58) Field of Classification Search
CPC ............ G08B 13/2494; G08B 13/2491; G01R 29/14; G01R 29/12; G01R 29/24;
(Continued)

(56) References Cited

U.S. PATENT DOCUMENTS 5,844,415 A   12/1998   Gershenfeld et al.
6,188,318 B1   2/2001   Katz et al.
(Continued)

FOREIGN PATENT DOCUMENTS

EP   0725960 B1   8/2000
EP   0896678 B1   2/2003
(Continued)

OTHER PUBLICATIONS

Amoruso et al., "An improved model of man for ESD applications," *Journal of Electrostatics* 49:225-244, 2000.
(Continued)

*Primary Examiner* — Raul J Rios Russo
(74) *Attorney, Agent, or Firm* — SEED INTELLECTUAL PROPERTY LAW GROUP LLP

(57) ABSTRACT

A method for presence detection in an environment to be monitored, includes generating an electric charge signal in a condition of absence of presence in the environment to be monitored. An electric charge signal is generated in an operating condition in which a person may be present in the environment. The two generated signals are processed and the results of the processing are compared. Processing the signals includes representing in a biaxial reference system the value of the charge signal considered and its derivative with respect to time, and identifying a plurality of points in the reference system. By comparing the position of the points acquired during the possible human presence with those of the base shape, a variation indicating the actual human presence may be detected. In this case an alarm signal is generated.

25 Claims, 5 Drawing Sheets

(51) Int. Cl.
*G01R 29/14* (2006.01)
*G01R 29/24* (2006.01)
*G01R 31/00* (2006.01)
G01N 27/60 (2006.01)
G01N 15/06 (2006.01)
G01N 15/02 (2006.01)

(52) U.S. Cl.
CPC ........... *G01R 29/24* (2013.01); *G01R 31/001* (2013.01); *G01N 15/0266* (2013.01); *G01N 15/0656* (2013.01); *G01N 27/60* (2013.01)

(58) Field of Classification Search
CPC ........ G01R 31/001; G01V 3/00; G01N 27/60; G01N 15/0656; G01N 15/0266
USPC .................................................. 324/457, 458
See application file for complete search history.

(56) References Cited

U.S. PATENT DOCUMENTS

| | | | |
|---|---|---|---|
| 6,922,059 | B2 | 7/2005 | Zank et al. |
| 7,489,024 | B2 | 2/2009 | Socher et al. |
| 8,274,386 | B1 | 9/2012 | Dea et al. |
| 10,042,446 | B2 | 8/2018 | Yoon et al. |
| 2006/0251293 | A1 | 11/2006 | Piirainen et al. |
| 2014/0232516 | A1 | 8/2014 | Stivoric et al. |
| 2016/0195630 | A1* | 7/2016 | Aponte Luis ............ G01V 3/12 324/457 |
| 2016/0216794 | A1 | 7/2016 | Yoon et al. |
| 2016/0342781 | A1 | 11/2016 | Jeon |
| 2018/0367656 | A1 | 12/2018 | Kim et al. |
| 2020/0174452 | A1* | 6/2020 | Zhao ....................... G08B 29/04 |
| 2022/0366768 | A1* | 11/2022 | Alessi .................... G08B 13/24 |

FOREIGN PATENT DOCUMENTS

| | | |
|---|---|---|
| EP | 1 587 041 A2 | 10/2005 |
| EP | 2 533 219 A1 | 12/2012 |
| EP | 2 980 609 A1 | 2/2016 |
| EP | 3 190 569 A1 | 7/2017 |
| EP | 3 372 460 A1 | 9/2018 |
| EP | 3791787 A1 | 3/2021 |
| KR | 10-2011-0061750 A | 6/2011 |
| KR | 20110061750 A | 6/2011 |
| KR | 102160255 B1 | 9/2020 |

OTHER PUBLICATIONS

Ficker, "Electrification of human body by walking," *Journal of Electrostatics* 64:10-16, 2006.

Kurita, "Development of Non-Contact Measurement System of Human Stepping," *SICE Annual Conference*, The University Electro-Communications, Japan, Aug. 20-22, 2008, pp. 1067-1070.

\* cited by examiner

SYSTEM AND METHOD FOR PRESENCE DETECTION IN AN ENVIRONMENT TO BE MONITORED

BACKGROUND

Technical Field

The present disclosure relates to a system and a method for presence detection in an environment to be monitored, for example for anti-theft or anti-intrusion purposes.

Description of the Related Art

Electric field sensors are used in alternative or in addition to accelerometer sensors for determining a user's activity, or for helping interpret the signals generated by other sensor devices.

An electric charge is a fundamental component of nature. The electrons of an element are easily transferred to another element in conditions of direct contact between the elements or at a distance. When the charge is transferred between two electrically insulated objects, a static charge is generated whereby the object with an excess of electrons is negatively charged and the object with a deficiency of electrons is positively charged.

Electrons move within an object in different ways depending on whether the object is a conductive or insulating object. In a conductor, electrons are more or less evenly distributed throughout the material and may easily move based on the influence of external electric fields. In an insulator, the charge mainly exists on the surface. The charge may however be movable, depending on the properties of the material and other environmental factors.

Nowadays there are many technologies and products that deal with anti-intrusion application and presence detection. Here is a list of the most common approaches for detecting an intrusion: Thermal image of a subject through infrared sensors; Passive infrared reacting to temperature variation (PIR); Active infrared wherein a ray from an emission point and a reception point is interrupted; Emission of microwaves being reflected by a subject, with the possibility of also measuring the speed of the subject; Ultrasound; use of beam-type photoelectric devices; use of microphones; use of cameras.

All the above-mentioned methods offer strengths and weaknesses in detecting an unwanted intrusion. This is the reason why the most robust and sophisticated systems combine multiple technologies together. For example, the passive infrared sensors are sensitive to environmental temperatures, while microwave anti-intrusion systems are unable to detect behind metal objects. In addition, a fluorescent light or a slight movement may trigger alarms. For this reason, dual technology based on the combination of PIR and microwaves is quite common. By crossing both information and alarms, an anti-intrusion system becomes more reliable with respect to false positives and unwanted alarms, and attains further advantages such as immunity with respect to pets. Below are some examples of the prior art.

Patent document EP2533219 describes an anti-intrusion system comprising at least one microwave detection device, for detecting the unauthorized entry of a subject into an area under surveillance; the detection device comprising an emitting antenna for emitting microwaves and a receiving antenna for receiving the reflected signal.

Patent document U.S. Pat. No. 6,188,318 describes a microwave plus PIR dual technology intrusion detector with immunity to pets.

Patent document EP1587041 describes an intrusion detection system comprising a passive infrared optic and a microwave transceiver.

Devices detecting the variation of the electric field generated by a person during the movements of the same, or exploiting a capacitive-type detection are also known. Technologies using the latter type of detection include, for example, touch screens, systems for detecting the occupant position in automobiles, and devices for determining the position, the orientation and the mass of an object, such as, for example, described in patent document U.S. Pat. No. 5,844,415 regarding an electric field detection device for determining the position, the mass distribution and the orientation of an object within a defined space, arranging a plurality of electrodes within the defined space. This technical solution can also be used to recognize a user's gestures, hand position and orientation, for example for interactive use with a processing system, in place of a mouse or a joystick.

Patent document KR20110061750 refers to the use of an electrostatic sensor in association with an infrared sensor for detecting the presence of an individual. The specific application relates to the automatic opening/closing of a door.

Patent document EP2980609 relates to the use of an electrostatic field sensor in addition to a magnetic sensor for detecting a human presence in an environment.

The scientific document by K. Kurita, "Development of Non-Contact Measurement System of Human Stepping", SICE Annual Conference 2008, Japan, illustrates a system and a method for counting the steps taken by a subject exploiting a contactless technique. This technique provides for detecting the electrostatic induction current, generated as a direct consequence of the movement of the subject in the environment, through an electrode placed at a distance of 1.5 m from the subject. However, the experiment illustrated in this document is carried out under ideal conditions, and is a mere demonstration of the technology feasibility to step counting.

In addition to the disadvantages already highlighted, none of the above-mentioned documents teaches a system and/or a method for presence detection in an environment to be monitored, in particular for anti-intrusion or anti-theft purposes, for being implemented without the aid of a plurality of sensors requiring mutual cooperation and of high reliability.

The need is therefore felt to make up for the shortcomings of the prior art by providing a system and a method for presence detection in an environment to be monitored.

BRIEF SUMMARY

According to the present disclosure, a system and a method for presence detection in an environment to be monitored are provided.

In one or more embodiments, a system for presence detection in an environment to be monitored is provided that includes a processing unit and an electrostatic charge sensor. The electrostatic charge sensor is coupled to the processing unit and configured to detect an electrostatic charge in the environment and generate an electrostatic charge signal. In a starting condition of absence of presence in the environment to be monitored, the processing unit is configured to: acquire a first electrostatic charge signal; sample the first electrostatic charge signal, and generate a first sampled signal formed by a plurality of first samples; for each first sample, calculate a derivative with respect to time, and generate a first derivative signal formed by a respective plurality of second samples, each first sample and respective second sample being coordinates of a respective first point in a biaxial reference system; calculate a first mean value of at least some of the first samples; and calculate a second mean value of at least some of the second samples.

In one or more embodiments, a method for presence detection in an environment to be monitored is provided that includes: in a starting condition of absence of presence in the environment to be monitored: acquiring a first electrostatic charge signal in the environment to be monitored; sampling the first electrostatic charge signal, and generating a first sampled signal formed by a plurality of first samples; for each first sample, calculating a derivative with respect to time, and generating a first derivative signal formed by a respective plurality of second samples, each first sample and respective second sample being coordinates of a respective first point in a biaxial reference system; calculating a first mean value of at least some of the first samples; and calculating a second mean value of at least some of the second samples.

BRIEF DESCRIPTION OF THE SEVERAL VIEWS OF THE DRAWINGS

For a better understanding of the disclosure, embodiments thereof are now described, purely by way of non-limiting example and with reference to the attached drawings, wherein.

DETAILED DESCRIPTION

Figure 1:
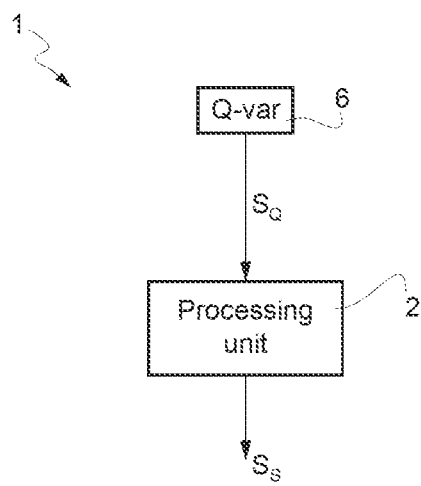
FIG. 1 schematically illustrates a system for presence detection including an environmental electric charge sensor and a processing unit, according to an embodiment of the present disclosure.

FIG. 1 schematically illustrates a presence detection system, or anti-intrusion system, 1. The presence detection system 1 is for detecting a human presence in an environment and comprises a processing unit 2 and an electrostatic charge sensor 6 coupled to the processing unit 2.

The processing unit 2 receives from the electrostatic charge sensor 6 a signal $S_Q$ related to an environmental electric charge in the monitored environment and generates, as a function of the charge signal $S_Q$, an "interrupt" signal that is a signal warning about a person's presence in the environment considered and monitored.

The processing unit 2 may include any circuitry configured to perform the various operations as described herein. In some embodiments, the processing unit 2 is, for example, a computer including a microcontroller, while the electrostatic charge sensor 6 is illustrated in FIG. 2 and described with reference to such figure.

Figure 2:
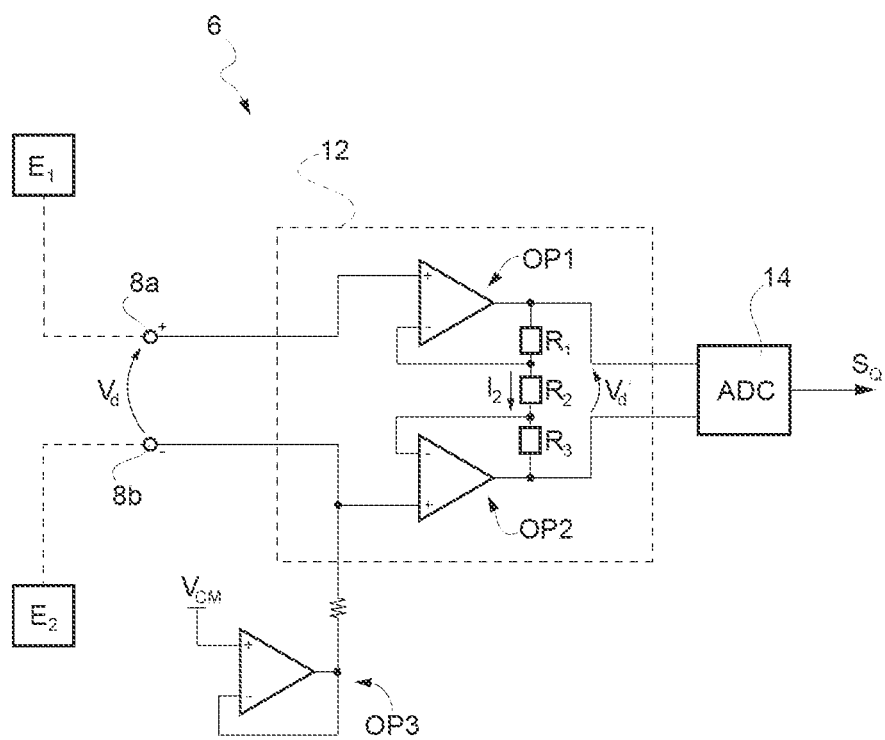
FIG. 2 illustrates an embodiment of the environmental electric charge sensor.

FIG. 2 illustrates an exemplary and non-limiting embodiment of the electrostatic charge sensor 6. The electrostatic charge sensor 6 comprises a pair of input terminals 8a, 8b, coupled to input electrodes E1, E2, respectively.

Each of the electrodes E1, E2 is, in one embodiment, made of conductive material, coated with an insulating layer. The geometry of the electrodes E1, E2 determines the sensitivity which, in the first approximation, is proportional to the surface of the electrodes themselves; the shape of the electrodes and their positioning in space affects the directivity, the rejection of signals common to both electrodes (the input stage is differential, therefore it "cancels" the signals that are present at the same time on both channels, and amplifies the differences). In an exemplary embodiment, the electrodes E1, E2 are square in shape, with side equal to about 2-10 cm, for example 5 cm.

In particular, the input electrodes E1, E2, are arranged in the environment wherein it is desired to detect a human presence, while the rest of the electrostatic charge sensor 6 may also be arranged outside the environment to be monitored, or inside such environment, indifferently.

The pair of input terminals 8a, 8b receives from the respective electrodes E1, E2 an input voltage Vd (differential signal), being supplied to an instrumentation amplifier 12. In a per se known manner, a human presence generates a variation of the environmental electrostatic charge which, in turn, after having been detected by the electrodes E1, E2, generates the input voltage Vd.

The instrumentation amplifier 12 comprises, in an exemplary embodiment, two operational amplifiers OP1 and OP2 and a biasing stage (buffer) OP3 having the function of biasing the instrumentation amplifier 12 to a common mode voltage VCM.

The inverting terminal of the amplifier OP1 is connected to the inverting terminal of the amplifier OP2 by means of a resistor $R_2$ across which there is a voltage equal to the input voltage Vd; therefore, a current equal to $I_2 = Vd/R_2$ will flow through this resistor $R_2$. This current $I_2$ does not come from the input terminals of the operational amplifiers OP1, OP2 and therefore runs through the two resistors $R_1$ connected between the outputs of the operational amplifiers OP1, OP2, in series with the resistor $R_2$; the current $I_2$, therefore running through the series of the three resistors $R_1$-$R_2$-$R_1$, produces an output voltage Vd' given by $Vd' = (2R_1+R_2)I_2 = (2R_1+R_2)Vd/R_2$. Therefore, the overall gain of the circuit of FIG. 2 is $Ad = Vd'/Vd = (2R_1+R_2)/R_2 = 1+2R_1/R_2$. The differential gain depends on the value of the resistor $R_2$ and may therefore be modified by acting on the resistor $R_2$.

The differential output Vd', therefore being proportional to the potential Vd between the input electrodes 8a, 8b, is input to an analog-to-digital converter 14, which outputs the charge variation signal $S_Q$ for the processing unit 2. The charge variation signal $S_Q$ is, for example, a high-resolution digital stream (16 bits or 24 bits). The analog-to-digital converter 14 is optional, since the processing unit 2 may be configured to work directly on the analog signal, or may itself comprise an analog-to-digital converter for converting the signal Vd'.

Alternatively, in the presence of the analog-to-digital converter 14, the instrumentation amplifier 12 may be omitted, so that the analog-to-digital converter 14 receives the differential voltage Vd between the electrodes E1, E2 and samples this signal Vd directly.

Figure 3:
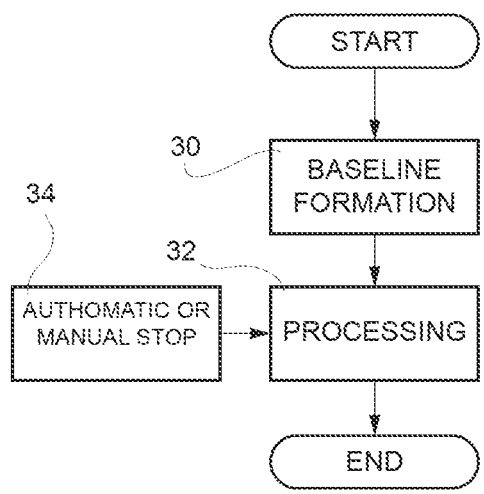
FIG. 3 illustrates, by means of a flow chart, steps of a method implemented by the system of FIG. 1.

FIG. 3 illustrates by means of a flow chart a method for human presence detection implemented by the system 1 of FIG. 1.

With reference to step 30 of FIG. 2, a starting condition is defined characterized by an absence of human presence in the environment to be monitored. This operation is performed by acquiring the signal $S_Q$ by means of the electrodes E1, E2 in a controlled condition, that is in a condition wherein it is certain that there is no human presence in the monitored area. The signal $S_Q$ is then processed, step 32, in order to detect a variation in the environmental charge in the monitored environment with respect to said starting condition.

In the event that the processing of step 32 detects a variation of the environmental charge considered significant with respect to the starting condition, then the interrupt signal is generated, identifying a condition of human presence detection. The interrupt signal may activate, for example, an anti-theft alarm or other type of signaling.

The processing of step 32 may be manually or automatically interrupted at any time, as identified by block 34 of FIG. 2. This step corresponds, for example, to the deactivation of the anti-intrusion system, for example due to the presence of the owner or manager of the anti-intrusion system. Alternatively, the deactivation may be programmed by means of timer, or controlled remotely.

Figure 4:
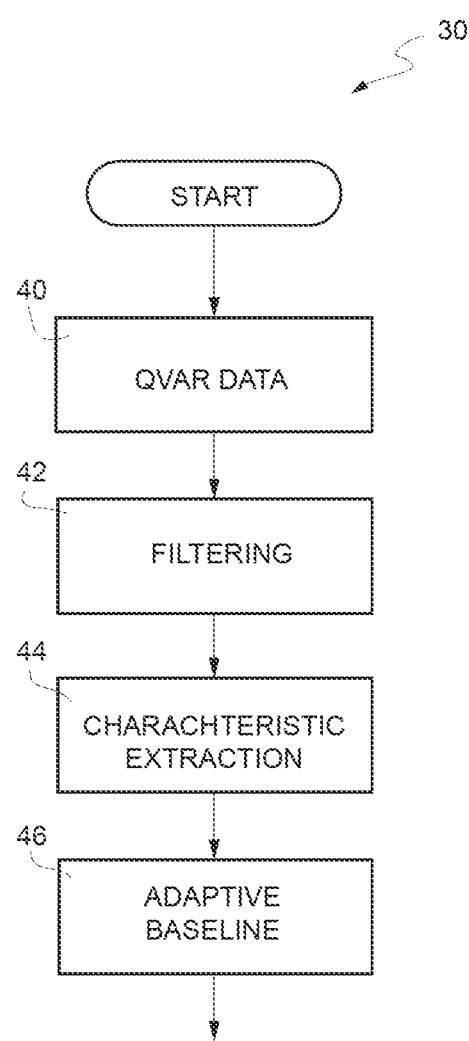
FIG. 4 illustrates, by means of a flow chart, a detail of the steps of the method of FIG. 3.

FIG. 4 illustrates, by means of a flow chart, a possible implementation of block 30 of FIG. 3.

Block 40 identifies the operation carried out by the converter 14 of FIG. 2, and provides for sampling the voltage Vd' at a sampling rate of 50 Hz, generating the signal $S_Q$. The sampling rate may be other than 50 Hz, for example in the range 50 Hz--1 kHz.

Then, block 42, a filtering of the signal $S_Q$ is optionally carried out, to remove or attenuate possible spectral components unrelated to the human presence and/or to a movement of a human being in the monitored environment.

The Applicant has verified that the motion in space of a human being, detected by means of the device 6 of FIG. 2, has spectral components mainly in the range 0-20 Hz, while spectral components centered on the 50 Hz (alternatively, 60 Hz) in particular in the range 40-70 Hz, are useful for detecting the proximity of a human being to the electrodes E1, E2.

Based on the above, the step of block 42 provides for a first low-pass filtering to insulate the components of the signal $S_Q$ in the range 0-20 Hz, and a second band-pass filtering to insulate the components of the signal $S_Q$ in the range 40-70 Hz.

Alternatively, a single filtering of the components of the signal $S_Q$ in the range 0-60 Hz may be carried out.

It is apparent that the indicated ranges may be modified as needed, also as a function of the hardware available. As said, the filtering is optional, but its implementation makes the described method more robust.

A filtered signal $S_Q$ is thus obtained.

Then, block 44, parameters of interest are extracted from the signal $S_Q$ (in the following, reference is made to "signal $S_Q$" to indifferently identify such signal $S_Q$ with or without filtering) which will be used to carry out the comparison between the starting condition (absence of human presence) and the condition of human presence detection.

The operations of block 44 provide for the construction of a state diagram in a biaxial reference system of coordinates X and Y, where X is the abscissa axis and Y the ordinate axis. On the X-axis the sampled values of the signal $S_Q$ are represented; on the Y-axis the values proportional to the derivative with respect to the time of each respective sampled value of $S_Q$ represented on the X-axis, that is $SF \cdot d(x1-xN)/dt$, are represented, where SF is a scale factor typically in the range 1-10, having the function of making the values of the derivative of $S_Q$ of the same order of magnitude as those of the signal $S_Q$ and x1-xN are the sampled values of the signal $S_Q$.

Each value of the derivative is calculated by processing a certain number of points of the sampled signal. Estimating the derivative as $y_i=(x_{i+1}-x_i)/dt$ is a way to carry out this operation (known as "forward difference method"), where dt is the sampling period. Other methods allow the derivative to be estimated with higher accuracy and lower sensitivity to noise, employing a greater number of points; in the method known as "second order central difference" it is $y_i=(x_{i+1}-x_{i-1})/2dt$; in the method known as "fourth order central difference" it is $y_i=(-x_{i+2}+8x_{i+1}-8x_{i-1}+x_{i-2})/12dt$.

In view of the above, each point of the derivative vector [y1, . . . , yN] is obtained by moving a moving evaluation window, of length dependent on the employed method, on the vector [x1, . . . , xN]. In other words, for each sampled value x1, . . . , xN of the signal $S_Q$ (represented on the X-axis), a respective value y1, . . . , yN represented on the Y-axis is then calculated, where $y1=SF \cdot (dx/dt)_{x1}$, $yN=SF \cdot (dx/dt)_{xN}$.

Figure 5A:
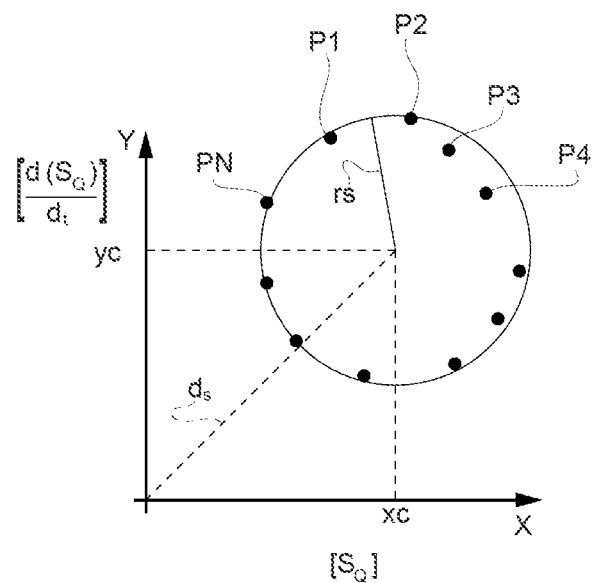
FIGS. 5A and 5B are a graphic representation of a processing of the environmental charge signal provided by the sensor of FIG. 2, according to the method of FIG. 3 and in a condition of absence of presence condition in the environment to be monitored.
Figure 5B:
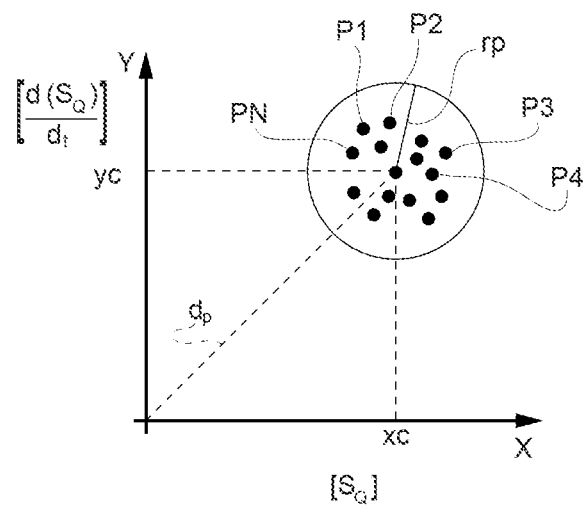

In the previously illustrated embodiment, the voltage Vd' is, as said, sampled at 50 Hz. This means representing 2 seconds of the signal Vd' with 100 samples x1-x100 (i.e., N=100) of the signal $S_Q$. In the X-, Y-biaxial reference system of the state diagram, 100 points P1, . . . , P100 are thus represented, each defined by respective coordinates P1=(x1, y1), . . . , PN=(xN, yN). The Applicant has verified that, according to the type of signal $S_Q$, this operation generates the state diagram of FIG. 5A or the state diagram of FIG. 5B. The case of FIG. 5A is obtained when the signal acquired by the electrodes E1, E2 is a signal with the presence of a harmonic component (due, for example, to the electric field generated by the power grid), while the case of FIG. 5B is obtained when the signal acquired by the electrodes E1, E2 is a signal without relevant harmonic components. The signal, in abscissa, is sinusoidal and the derivative, in ordinate, cosinusoidal; the composition in the XY-reference system is therefore ideally distributed over a circumference, as illustrated for example in FIG. 5A.

The amplitude of the signal $S_Q$ depends on several factors, including the type (shape, materials, etc.) of the electrodes E1, E2, their arrangement in space, and other factors (for example the configuration of the gain parameters of the analog stage, the filter band, the sampling frequency). However, the present disclosure finds application regardless of the aforementioned parameters, causing the generation of the state diagram of FIG. 5A or that of FIG. 5B.

As it is noted from FIG. 5A, the points P1, . . . , PN are substantially evenly distributed here over a circumference of radius rS and geometric center (centroid, of coordinates xC, yC) at a distance dS from the intersection of the X- and Y-axes of the biaxial reference system used.

As it is noted from FIG. 5B, in this case the points P1, . . . , PN are distributed in a more concentrated manner to form a "fog" confinable within a circumference of radius rP and geometric center (centroid, of coordinates xC, yC) at a distance dP from the intersection of the X- and Y-axes of the biaxial reference system used.

The centroid, in the case of both FIG. 5A and FIG. 5B, is defined as the barycenter of the points P1-PN. If the signal $S_Q$ is sampled at 50 Hz, the centroid is calculated on the basis of the last 2 seconds of acquisition (100 points P1-PN, with N=100). The coordinates xC and yC of the centroid are therefore given by:

xC=mean(X1–xN), that is xC is the mean of all the coordinates on the X-axis of the points P1, . . . , PN (that is, the mean of x1, xN);

yC=mean(y1–yN), that is yC is the mean of all the coordinates on the Y-axis of the points P1, . . . , PN (that is, the mean of y1, yN).

Turning back to FIG. 4, block 46 provides for the calculation of a "baseline", that is a state diagram representing the starting and reference condition (absence of human presence), for the successive recognition of the human presence by means of comparison. The baseline corresponds to what illustrated in FIGS. 5A, 5B (according to the respective case of intense or weak signal), acquiring the signal $S_Q$ in the absence of human presence in the environment to be monitored and constructing the respective state diagram.

On the basis of what previously discussed, the baseline is therefore a circle with a geometric center of coordinates xC, yC and radius rS or rP (according to the respective case of intense or weak signal, respectively).

The definition of the radius rS/rP of the baseline may be carried out according to one of the following modes:

a. The radius rS/rP is the mean value $d_{MEAN}$ of some of the distances d1-dN of the points P1, . . . , PN from the centroid (for example 10-50 distances); or b. The radius rS/rP is the mean value $d_{MEAN}$ of all the distances d1-dN of the points P1, . . . , PN from the centroid.

In this context, the distance d1-dN of each point P1-PN from the centroid is the length of the straight line connecting the respective point P1-PN to the centroid. For example, for the point PN, of coordinates xN, yN, the distance dN from the centroid is calculated as SQRT[$(xN-xC)^2+(yN-yC)^2$], where "SQRT" represents the square root operation.

Furthermore, a value proportional (e.g., with proportionality factor k in the range 2-7) to the standard deviation a of the aforementioned distances may be added to the value of the radius rS/rP calculated according to one of the possibilities identified above. In this case it is rS=$d_{MEAN}$+k·σ (similarly, rP=$d_{MEAN}$+k·σ).

A further possibility for calculating the radius rS or rP provides for the radius rS or rP be the greater of the distances d1-dN of the points P1, . . . , PN from the centroid, possibly multiplied by a margin factor. The margin factor may be 1 in case all the points P1, . . . , PN are at the same distance from the centroid, or the margin factor is greater than 1 (e.g., 1.1-1.5) so as to take into account possible disturbances (noise). The margin factor greater than 1 therefore guarantees a greater tolerance upon detection.

Figure 6:
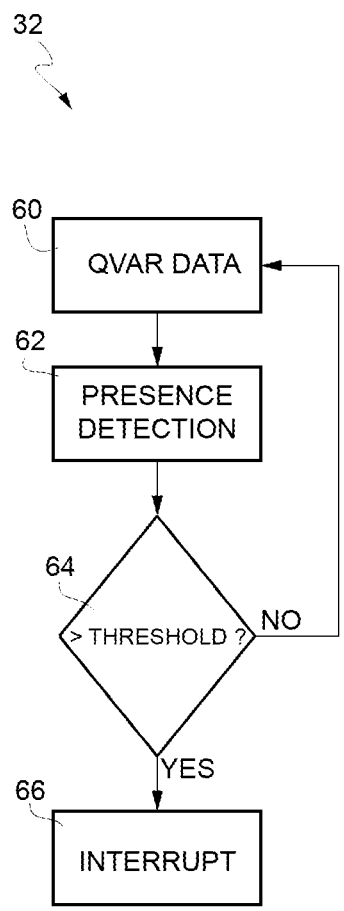
FIG. 6 illustrates, by means of a flow chart, a further detail of the steps of the method of FIG. 3.

With reference to FIG. 6, the operations corresponding to block 32 of FIG. 3 are illustrated.

During use, the signal $S_Q$ is constantly monitored (block 60), for example at regular intervals, and a human presence check is carried out (block 62).

A current state diagram is constructed at block 62, using the (sampled) signal $S_Q$ acquired at block 60 for the current monitoring interval, and this current state diagram is compared with that of the baseline stored.

Figure 7A:
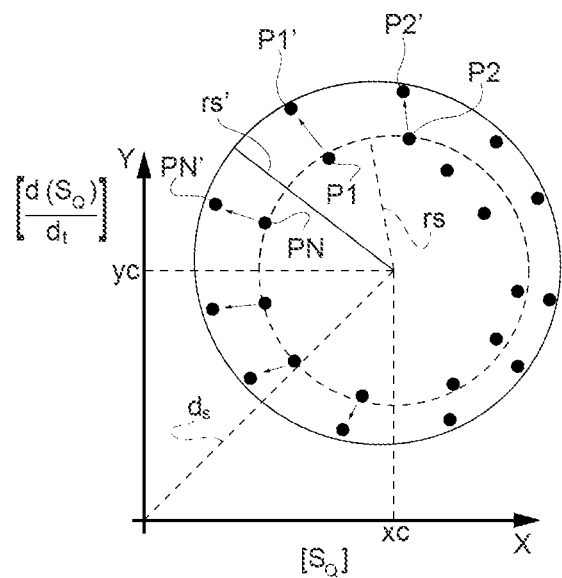
FIGS. 7A and 7B are a graphic representation of a processing of the environmental charge signal provided by the sensor of FIG. 2, according to the method of FIG. 3 and in a condition of human presence in the environment to be monitored and with strong or intense environmental charge signal (due to an electric field generated by the power grid at 50 Hz or 60 Hz)
Figure 7B:
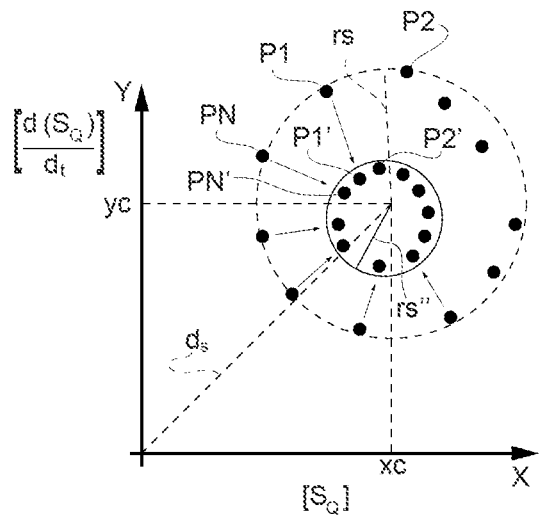

The Applicant has verified that in the case of human presence, the state diagram of FIG. 5A varies as illustrated in FIGS. 7A and 7B, that is deforming the circle of the baseline. In particular, the deformation follows a specific pattern in the case of intense signal. If a human presence approaching the electrodes E1, E2 is detected, the radius rS increases to a value rS'>rS (FIG. 7A). If a human presence moving away from the electrodes E1, E2 is detected, the radius rS reduces to a value rS"<rS (FIG. 7B).

It is therefore sufficient to verify a current variation of the radius rS' or rS" with respect to the radius rS of the baseline to generate the interrupt (block 66 of FIG. 6) identifying the human presence detection. It is apparent that, to avoid false alarms, the interrupt may be generated when variations in the value of the radius rS above a predefined safety threshold are identified (block 64 of FIG. 6). This safety threshold corresponds, for example, to a variation equal to at least 10% of the radius rS.

Figure 8A:
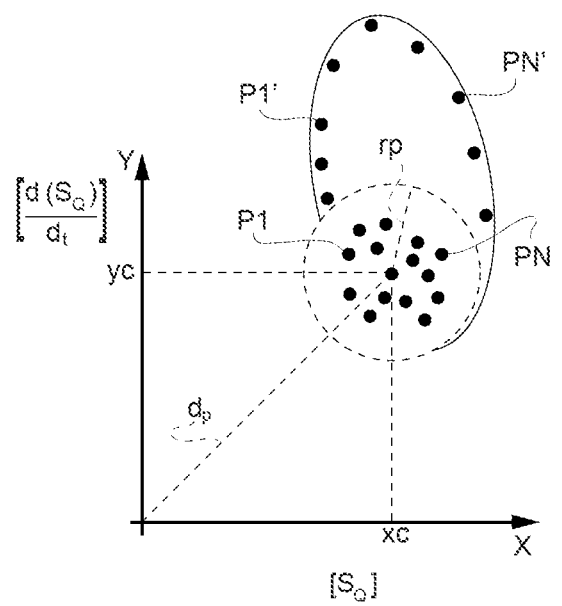
FIGS. 8A and 8B are a graphic representation of a processing of the environmental charge signal provided by the sensor of FIG. 2, according to the method of FIG. 3 and in a condition of human presence in the environment to be monitored and with a weak environmental charge signal (that is of an electrostatic field or slowly variable signal, for example generated by a power grid, and not very intense).
Figure 8B:
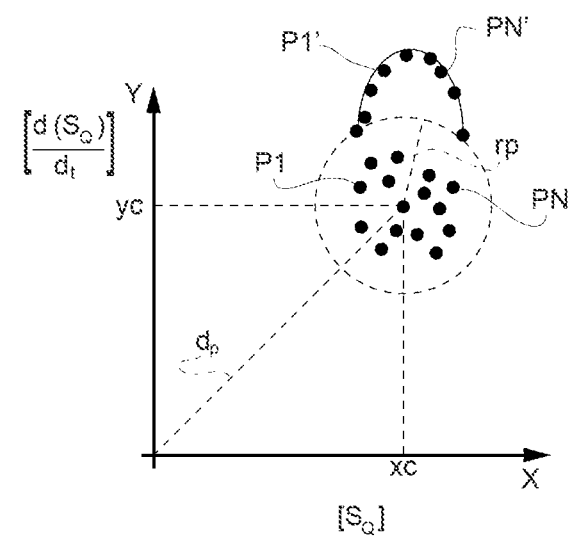

The Applicant has also verified that, in the case of human presence and weak signal, the state diagram of FIG. 5B varies as illustrated in FIGS. 8A and 8B, that is deforming the circle of the baseline differently from the case of strong signal. In particular, the deformation follows a pattern reminding of an ellipse. If a human presence approaching the electrodes E1, E2 is detected, the distribution of the points P1'-PN' with respect to the condition of the baseline is illustrated in FIG. 8A; if a human presence moving away from the electrodes E1, E2 is detected, the distribution of the points P1-PN with respect to the condition of the baseline is illustrated in FIG. 8B.

In this condition of use, the distance d1', dN' of the points P1', PN' with respect to the centroid (xC, yC) of the baseline may be verified; if all the points P1', . . . , PN', or a number of points greater than a predefined number, have a respective distance d1'-dN' from the centroid (xC, yC) of the baseline greater than the radius rP previously calculated, then the interrupt identifying the human presence detection is generated (block 66).

For some or all the points P1, . . . , PN, it is therefore important to detect whether over time there is a variation taking these points out of the baseline circle. To this end, a calculation of Euclidean distance between the coordinates of this point and the coordinates of the centroid may be carried out at regular intervals, in the X-, Y-reference system. For example, for the point PN, of coordinates xN, yN, the Euclidean distance from the centroid is calculated as SQRT[$(xN-xC)^2+(yN-yC)^2$], where "SQRT" represents the square root operation. If the Euclidean distance thus calculated is greater than the radius rS/rP of the baseline, then the point PN is identified as the point outside the baseline circle. The criterion for identifying a human presence may vary as needed. For example, the verification of a minimum number of points outside the baseline not temporally consecutive may be used as a threshold criterion; or a criterion providing for the need to have a minimum number of points consecutive to each other to determine the human presence may be used.

In practice, however, the Applicant has verified that the environmental charge has no immutable value over time even in the absence of human presence. This means that the coordinates xC, yC of the baseline centroid and the radius rS/rP of the baseline circle vary over time. Updating the baseline at regular intervals, for example every 2-5 minutes, by performing the operations of block 30 of FIG. 3 is therefore provided.

When there is the need for defining for the first time the baseline, or successively updating the baseline, the operations of block 30 of FIG. 3 may be carried out only once or a plurality of consecutive times, before storing the coordinates of the centroid and the value of the radius of the baseline. Since the system might be in a transitory step, thus not settled (may be due to a previous presence detection), this procedure allows the parameters of interest (centroid and radius) to be acquired in a stationary condition for the system.

For example, the following routine is carried out for defining the baseline at block 30 of FIG. 3:

STEP 1
 a. acquisition of the signal $S_Q$,
 b. formation of the state diagram.

STEP 2
 c. calculation of the centroid coordinates,
 d. calculation of the mean of the distances of each point P1-PN in the state diagram from the current centroid,
 e. calculation of the value k·σ, proportional to the standard deviation σ of each point P1-PN in the state diagram with respect to the current centroid.

STEP 3
 f. definition of the baseline as the circle having radius equal to the mean of the distances of each point P1-PN in the state diagram from the current centroid, added to k·σ.

STEP 4
 g. it is verified that the following conditions are valid for a consecutive number of times (e.g., three times):
   that the variation of the coordinates of the centroid in successive calculations of the same remains smaller than a threshold, and
   that the variation of the radius in successive calculations of the same remains smaller than a respective threshold.

Then, the last values calculated for the coordinates xC, yC of the centroid and for the radius rS/rP of the centroid are set as the values defining the baseline.

Furthermore, as said, during the operation of the anti-intrusion system, the baseline is updated at regular intervals (e.g., every minute or a few minutes) in order to take into account any minimum natural variations in the monitored environment and not related to a human presence. As previously said, a variation below threshold does not cause the generation of the interrupt, but, in this case, an update of the baseline (that is, an update of the coordinates xC, yC of the centroid and the value of the radius rS/rP).

The advantages achieved by the present disclosure are apparent from the previous description.

In particular, the following advantages are obtained with respect to the prior art:
 insensitivity to environmental conditions;
 very low consumption when compared with other technologies (infrared, microwaves etc.);
 smaller size and ease of integration into existing devices, containers, hardware;
 unlike common detectors, equipped with "lenses" or antennas that constrain the shape thereof, the geometry of the electrodes and thus of the detector may be modeled as a function of the application; and
 presumably reduced cost with respect to current solutions.

Further variants, with respect to what described, may also be provided.

For example, although FIG. 2 illustrates only two electrodes E1, E2, a plurality of electrodes connected to the input terminal 8*a* and a plurality of electrodes connected to the input terminal 8*b* may be provided.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system for presence detection in an environment to be monitored, comprising:
 a processing unit; and
 an electrostatic charge sensor, coupled to the processing unit, configured to detect an electrostatic charge in the environment and generate an electrostatic charge signal,
 wherein, in a starting condition of absence of presence in the environment to be monitored, the processing unit is configured to:
  acquire a first electrostatic charge signal;
  sample the first electrostatic charge signal, and generate a first sampled signal formed by a plurality of first samples;
  for each first sample, calculate a derivative with respect to time, and generate a first derivative signal formed by a respective plurality of second samples, each first sample and respective second sample being coordinates of a respective first point in a biaxial reference system;
  calculate a first mean value of at least some of the first samples; and
  calculate a second mean value of at least some of the second samples.

2. The system according to claim 1, wherein
 in the starting condition, the processing unit is configured to:
  define a circular base shape by calculating a radius of a circumference having as geometric center the first and the second mean values and enclosing all the first points in the biaxial reference system,
  and wherein, in an operating condition successive to the starting condition, the processing unit is configured to:
   acquire a second current electrostatic charge signal;
   sample the second electrostatic charge signal, and generate a second sampled signal formed by a plurality of third samples;
   for each third sample, calculate a derivative with respect to time, and generate a first derivative signal formed by a respective plurality of fourth samples, each third sample and respective fourth sample being coordinates of a respective second point in the biaxial reference system;
   verify whether one or more of the second points have coordinates, in the biaxial reference system, outside the circular base shape; and
   generate a detection signal of the presence in the monitored environment in response to verifying that one or more of the second points have coordinates, in the biaxial reference system, outside the circular base shape.

3. The system according to claim 2, wherein the processing unit is configured to sample the first and second electrostatic charge signals at 50 Hz.

4. The system according to claim 2, wherein the processing unit is configured to:
filter the first electrostatic charge signal with a passband in a range of 0-20 Hz and 40-70 Hz, after acquiring the first electrostatic charge signal; and
filter the second electrostatic charge signal with a passband in a range of 0-20 Hz and 40-70 Hz, after acquiring the second electrostatic charge signal.

5. The system according to claim 2, wherein calculating the radius of the circumference includes setting the radius to a value of a maximum distance between the geometric center and each of the first points.

6. The system according to claim 2, wherein calculating the radius of the circumference includes setting the radius to a mean value of distances between the geometric center and each of the first points, added to a value proportional to the standard deviation of the distances between the geometric center and each of the first points.

7. The system according to claim 2, wherein calculating the radius of the circumference includes setting the radius to a mean value of two or more of distances between the geometric center and two or more respective first points, added to a value proportional to the standard deviation of the distances between the geometric center and each of the first points.

8. The system according to claim 2, wherein the processing unit is configured to verify whether a distance between the geometric center and the one or more of the second points is greater than the radius.

9. The system according to claim 2, wherein, during the starting condition, the processing unit is configured to repeat a plurality of times the acquiring the first electrostatic charge signal, sampling the first electrostatic charge signal, generating a first derivative signal, calculating a first mean value, calculating a second mean value, and defining a circular base shape.

10. The system according to claim 2, wherein, during the operating condition successive to the starting condition, the processing unit is configured to iterate the acquiring the first electrostatic charge signal, sampling the first electrostatic charge signal, generating a first derivative signal, calculating a first mean value, calculating a second mean value, and defining a circular base shape, in order to update the values of the first points, of the radius and of the geometric center, to take into account possible variations in the environmental electric charge due to factors other than the presence to be detected.

11. The system according to claim 10, wherein the processing unit is further configured to verify whether the first points updated meet a predetermined relation with the base shape calculated at the previous iteration.

12. The system according to claim 11, wherein verifying the predetermined relation includes one of:
verifying whether all the first points updated are at a distance from the geometric center calculated at the previous iteration equal to or smaller than the radius calculated at the previous iteration; or
verifying whether one or more of the first points updated are at a distance from the geometric center calculated at the previous iteration being greater than the radius calculated at the previous iteration, but smaller than a threshold of tolerance.

13. The system according to claim 1, wherein the electrostatic charge sensor comprises at least two electrodes configured to detect the electrostatic charge in the environment and generate an electric potential proportional to the electrostatic charge detected in the environment.

14. A method for presence detection in an environment to be monitored, comprising:
in a starting condition of absence of presence in the environment to be monitored:
acquiring a first electrostatic charge signal in the environment to be monitored;
sampling the first electrostatic charge signal, and generating a first sampled signal formed by a plurality of first samples;
for each first sample, calculating a derivative with respect to time, and generating a first derivative signal formed by a respective plurality of second samples, each first sample and respective second sample being coordinates of a respective first point in a biaxial reference system;
calculating a first mean value of at least some of the first samples; and
calculating a second mean value of at least some of the second samples.

15. The method according to claim 14, further comprising:
in the starting condition:
defining a circular base shape, and calculating a radius of a circumference having as geometric center the first and the second mean values and enclosing all the first points in the biaxial reference system, and
in an operating condition successive to the starting condition:
acquiring a second current electrostatic charge signal;
sampling the second electrostatic charge signal, and generating a second sampled signal formed by a plurality of third samples;
for each third sample, calculating a derivative with respect to time, and generating a second derivative signal formed by a respective plurality of fourth samples, each third sample and respective fourth sample being coordinates of a respective second point in the biaxial reference system;
verifying whether one or more of the second points have coordinates, in the biaxial reference system, outside the circular base shape; and
generating a detection signal of the presence in the monitored environment in response to verifying that one or more of the second points have coordinates, in the biaxial reference system, outside the circular base shape.

16. The method according to claim 15, wherein the sampling first and electrostatic charge signals is carried out at 50 Hz or 60 Hz.

17. The method according to claim 15, further comprising:
filtering, after acquiring the first electrostatic charge signal, the first electrostatic charge signal with a passband in a range of 0-20 Hz and 40-70 Hz; and
filtering, after acquiring the second electrostatic charge signal, the second electrostatic charge signal with a passband in a range of 0-20 Hz and 40-70 Hz.

18. The method according to claim 15, wherein calculating the radius of the circumference includes setting the radius to a value of a maximum distance between the geometric center and each of the first points.

19. The method according to claim 15, wherein calculating the radius of the circumference includes setting the radius to a mean value of distances between the geometric center and each of the first points, added to a value proportional to the standard deviation of the distances between the geometric center and each of the first points.

20. The method according to claim 15, wherein calculating the radius of the circumference includes setting the radius to a mean value of two or more of distances between the geometric center and two or more respective first points, added to a value proportional to the standard deviation of the distances between the geometric center and each of the first points.

21. The method according to claim 15, comprising verifying whether a distance between the geometric center and the one or more of the second points is greater than the radius.

22. The method according to claim 15, wherein, during the starting condition, the acquiring the first electrostatic charge signal, sampling the first electrostatic charge signal, generating a first derivative signal, calculating a first mean value, calculating a second mean value, and defining a circular base shape are repeated a plurality of times.

23. The method according to claim 15, further comprising, during the operating condition successive to the starting condition, iterating the acquiring the first electrostatic charge signal, sampling the first electrostatic charge signal, generating a first derivative signal, calculating a first mean value, calculating a second mean value, and defining a circular base shape, in order to update the values of the first points, of the radius and the geometric center, to take into account possible variations in the environmental electric charge due to factors other than the presence to be detected.

24. The method according to claim 23, further comprising verifying whether the first points updated meet a predetermined relation with the base shape calculated at the previous iteration.

25. The method according to claim 24, wherein verifying the predetermined relation includes one of:
   verifying whether all the first points updated are at a distance from the geometric center calculated at the previous iteration equal to or smaller than the radius calculated at the previous iteration; or
   verifying whether one or more of the first points updated are at a distance from the geometric center calculated at the previous iteration being greater than the radius calculated at the previous iteration, but smaller than a threshold of tolerance.

* * * * *